United States Patent
Li et al.

(10) Patent No.: US 10,473,723 B2
(45) Date of Patent: Nov. 12, 2019

(54) PARAMETER AND STATE LIMITING IN MODEL BASED BATTERY CONTROL

(71) Applicant: FORD GLOBAL TECHNOLOGIES, LLC, Dearborn, MI (US)

(72) Inventors: Yonghua Li, Ann Arbor, MI (US); Xu Wang, Dearborn, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 850 days.

(21) Appl. No.: 14/015,241

(22) Filed: Aug. 30, 2013

(65) Prior Publication Data
US 2015/0066405 A1    Mar. 5, 2015

(51) Int. Cl.
G01R 31/36     (2019.01)
G01R 31/382    (2019.01)
G01R 31/374    (2019.01)
G01R 31/367    (2019.01)

(52) U.S. Cl.
CPC ......... *G01R 31/367* (2019.01); *G01R 31/382* (2019.01); *G01R 31/374* (2019.01)

(58) Field of Classification Search
None
See application file for complete search history.

(56) References Cited

U.S. PATENT DOCUMENTS 7,321,220 B2 * 1/2008 Plett ............... G01R 31/361
                                                    320/116
2012/0143585 A1 * 6/2012 Barsukov .......... G01R 31/3651
                                                    703/18
2012/0179435 A1 * 7/2012 Song ............... G01R 31/3606
                                                    703/2
2014/0333317 A1 * 11/2014 Frost .............. G01R 31/3606
                                                    324/430

OTHER PUBLICATIONS

Plett, "Extended Kalman filtering for battery management systems of LiPB-based HEV battery packs Part 1. Background" Journal of Power Sources 134 (2004) 252-261.*
Plett, "Extended Kalman filtering for battery management systems of LiPB-based HEV battery packs Part 2. Modeling and identification" Journal of Power Sources 134 (2004) 262-276.*
Plett, "Extended Kalman filtering for battery management systems of LiPB-based HEV battery packs Part 3. State and parameter estimation" Journal of Power Sources 134 (2004) 277-292.*
Ungarala et al., "Constrained Extended Kalman Filter for Nonlinear State Estimation" 8th International Ifac Symposium on Dynamics and Control of Process Systems, Preprints vol. 2, Jun. 6-8, 2007.*

* cited by examiner

*Primary Examiner* — John C Kuan
(74) *Attorney, Agent, or Firm* — David B. Kelley; MacMillan, Sobanski & Todd, LLC

(57) ABSTRACT

A method of determining battery power capability may include: determining a circuit model for a battery, including a first resistance (r1) in series with a second resistance (r2) and a capacitance (C) in parallel; setting upper and lower limits for r1, r2 and C based on a battery temperature a battery state of charge or both; applying an EKF to determine r1, r2 and C within the set upper and lower limits; and outputting the battery power capability based on r1, r2 and C. The upper and lower limits may be adjusted based on the age of the battery.

20 Claims, 4 Drawing Sheets

US 10,473,723 B2

PARAMETER AND STATE LIMITING IN MODEL BASED BATTERY CONTROL

BACKGROUND OF INVENTION

The present invention relates to battery control in a vehicle, and more particularly in determining equivalent circuit model parameters for modeling of a battery circuit when estimating battery power capability.

When employing batteries to provide power for some systems, such as for example a battery electric or hybrid electric vehicle, an estimation of the battery power capability may be estimated by a battery equivalent circuit model. In addition, the determination of the circuit model parameters may be calculated using an optimal data fitting process, which may employ, for example, an extended Kalman filter (EKF). A concern with employing an EKF approach is that the estimated values for the parameters are based on data fitting from measurement data. This can lead to model mismatch, as well as being corrupted by sensor biases or measurement noises in the measurement data. This may result in biased estimation of the parameters. For example, such modeling bias can lead to an electrical resistance being modeled as negative, which is physically impossible.

A possible approach is to use all possible ranges of equivalent battery model parameters to decide the limits (bounds) of circuit model parameters. However, with this approach the range for the circuit model parameters may be much larger than desirable. For example, for a modeled resistance of the battery equivalent circuit model, the lower and upper bound may be very large relative to how large the variation can actually be.

Thus, a way to employ an equivalent circuit model to estimate battery power capability, while minimizing/correcting errors in the battery circuit model parameters is desired.

SUMMARY OF INVENTION

An embodiment contemplates a method of determining battery power capability comprising: determining a circuit model for a battery, including a first resistance (r1) in series with a second resistance (r2) and a capacitance (C) in parallel; setting upper and lower limits for r1, r2 and C based on a battery temperature; applying an EKF to determine r1, r2 and C within the set upper and lower limits; and outputting the battery power capability based on r1, r2 and C.

An embodiment contemplates a method of determining battery power capability comprising: determining a circuit model for a battery, including a first resistance (r1) in series with a second resistance (r2) and a capacitance (C) in parallel; setting upper and lower limits for r1, r2 and C based on a battery state of charge (SOC); applying an EKF to determine r1, r2 and C within the set upper and lower limits; and outputting the battery power capability based on r1, r2 and C.

An embodiment contemplates an electric vehicle comprising: a controller configured to estimate battery power capability; wherein the battery power capability estimation of the controller includes applying a circuit model for a battery, including a first resistance (r1) in series with a second resistance (r2) and a capacitance (C) in parallel; setting upper and lower limits for r1, r2 and C based on a battery temperature; applying an EKF to determine r1, r2 and C within the set upper and lower limits; adjusting vehicle operations based the battery power capability based on r1, r2 and C.

An advantage of an embodiment is that the estimated values for the battery equivalent circuit model parameters may be properly limited in an extended Kalman filter (EKF). This allows for erroneous estimations to be corrected, with the EKF converging to relatively accurate values for the circuit model parameters, and with desired speed.

An advantage is that the accuracy is obtained by creating upper and lower limits for the circuit model parameters using battery temperature and/or state of charge (SOC) of the battery, and can be based on lifetime variation of the parameters when employing EKF. Parameter ranges for temperature and state of charge are used, determining the lower limit and upper limit based on the SOC and temperature reading. These parameter ranges are relatively easy to obtain and easy to use in a model to estimate power capability of the battery, with an accurate bounding of estimated parameters and faster convergence.

DETAILED DESCRIPTION

Figure 1:
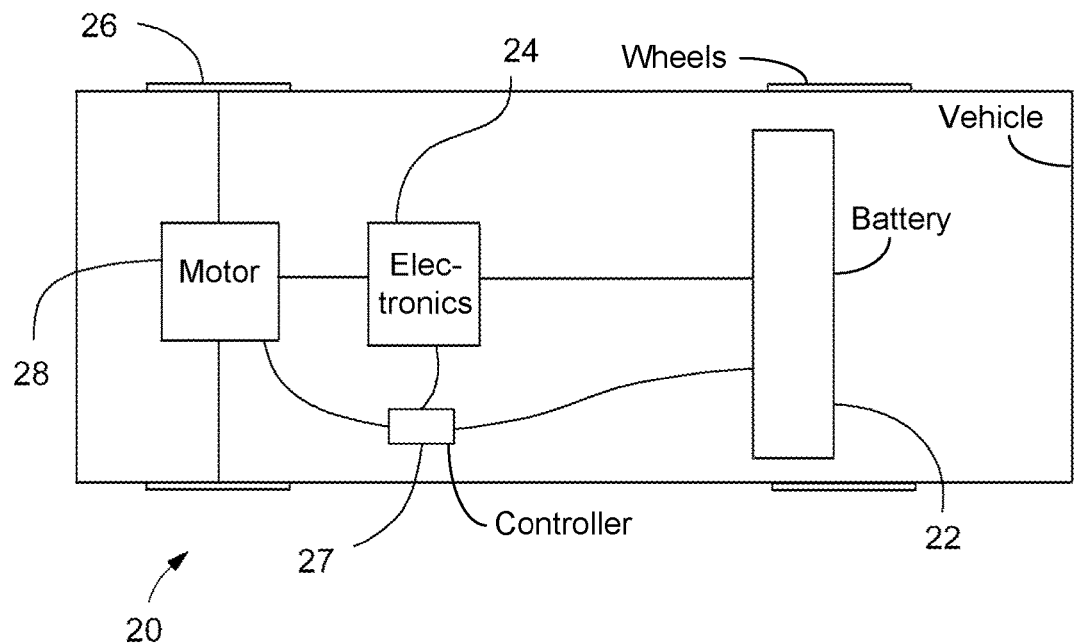
FIG. 1 is a schematic, block diagram of a portion of a vehicle.

FIG. 1 shows a schematic of a portion of a vehicle 20 that may include a battery 22, such as for example a lithium-ion battery, that is connected to vehicle power electronics 24. The battery 22 may be employed to provide power to a motor 28 that provides motive power to the vehicle wheels 26 to propel the vehicle. One or more controllers 27 may communicate with and control the various electric components in the vehicle 20. The controller 27 may be made up of various combinations of hardware and software, and may include memory, processor, and other electronic components, as is known to those skilled in the art. The vehicle 20 may be, for example, a battery electric vehicle, a hybrid electric type of vehicle, or a fuel cell type of vehicle. With such types of vehicles, battery power capability estimation may be desirable.

Figure 2:
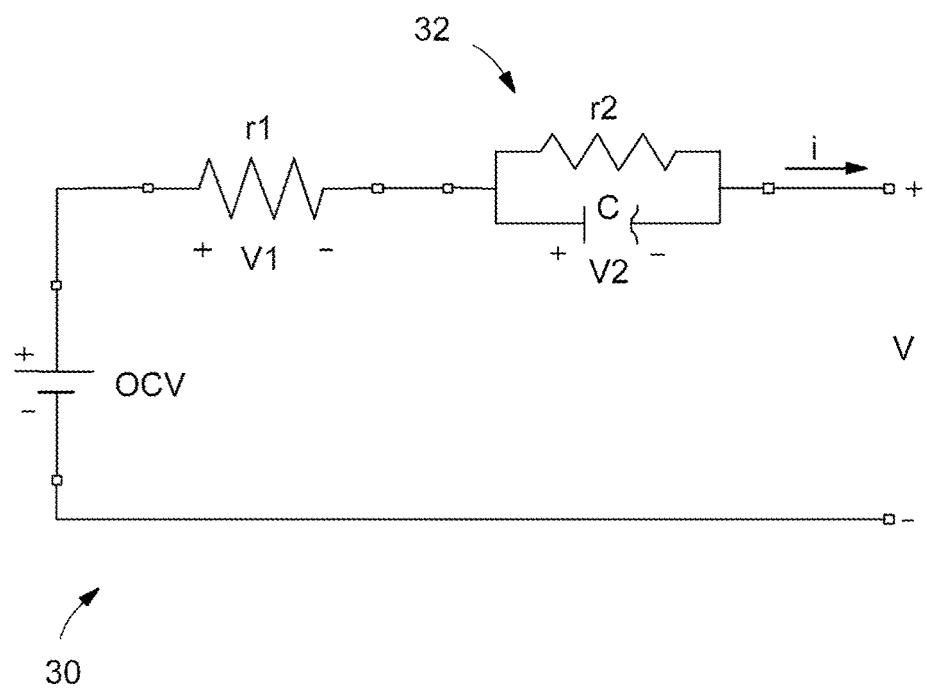
FIG. 2 is a schematic of a battery equivalent circuit model used in battery power capability estimation.

FIG. 2 illustrates a schematic of a battery equivalent circuit model 30 used in battery power capability estimation, for example, of a lithium-ion battery. The model 30 may include circuit model parameters such as a first resistance r1, which is a series resistance with a voltage drop V1, a second resistance r2, which is a resistance of a resistance-capacitance (RC) network, indicated generally at 32, a capacitance C, which is a capacitance of the RC network 32, and a voltage V2 across the RC network 32. An open circuit voltage (OCV), a battery terminal voltage V and a current i are also shown in the circuit model 30.

The estimation of the values for the first resistance r1, the second resistance r2, the capacitor C and the second voltage V2 are estimated using an extended Kalman filter (EKF).

Figure 3:
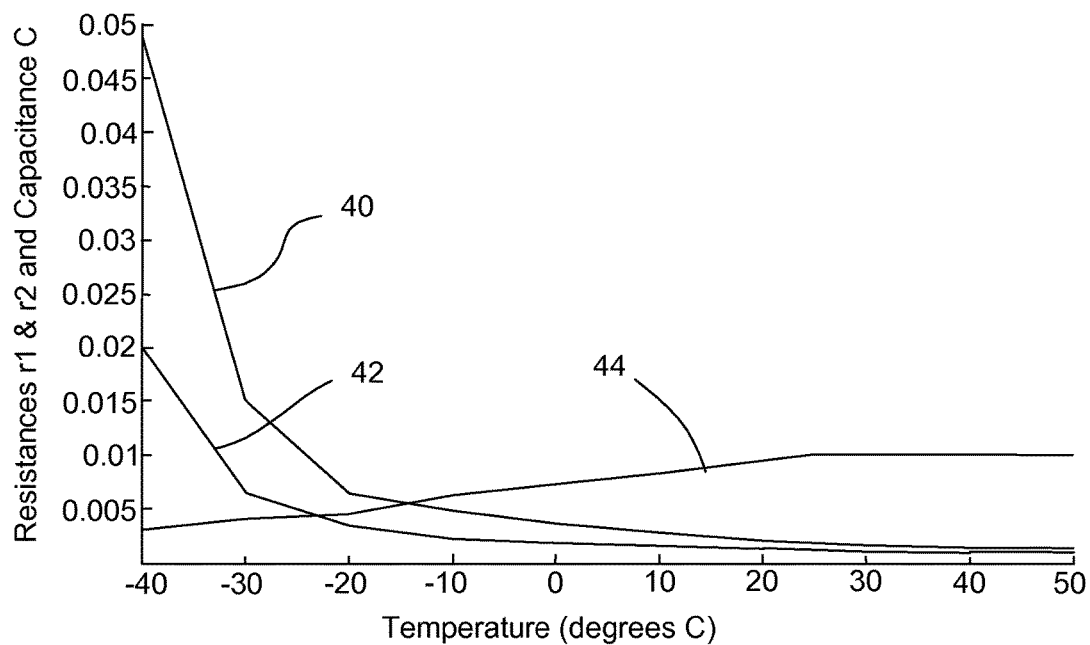
FIG. 3 is an exemplary graph illustrating beginning of battery life equivalent circuit model parameters and the variation relative to temperature.

The EKF is a method of nonlinear state estimation. EKFs, in general, are known to those skilled in the art. Application of Kalman filters are disclosed in U.S. Ser. No. 12/987,190, filed Jan. 10, 2011; U.S. Ser. No. 13/171,090, filed Jun. 28, 2011; and U.S. Ser. No. 13/171,118, filed Jun. 28, 2011; and assigned to the assignee of the present application; and all three are incorporated by reference herein in their entirety FIG. 3 is an exemplary graph illustrating beginning-of-life (beginning of the life of the battery) equivalent model data. The beginning-of-life battery equivalent circuit model parameters are shown as functions of temperature, in degrees Celsius (degrees C.), of the battery. The first (series) resistance r1 parameters (Ohm) as a function of temperature are shown by line 40. The second (RC) resistance r2 parameters (Ohm) as a function of temperature are shown by line 42. The capacitance (RC) C parameters (C/750000 Farad) as a function of temperature are shown by line 44. One will note that the resistances and capacitances of the equivalent circuit model vary with temperature, and accounting for these differences by limiting the parameter values for the EKF method may cause better and quicker convergence to accurate parameter values.

This variation in parameters for the first resistance r1, second resistance r2 and capacitance C is also true for state of charge (SOC), thus the first resistance r1, second resistance r2 and the capacitance C parameters may also be set for battery beginning-of-life based on the SOC of the battery.

Figure 4:
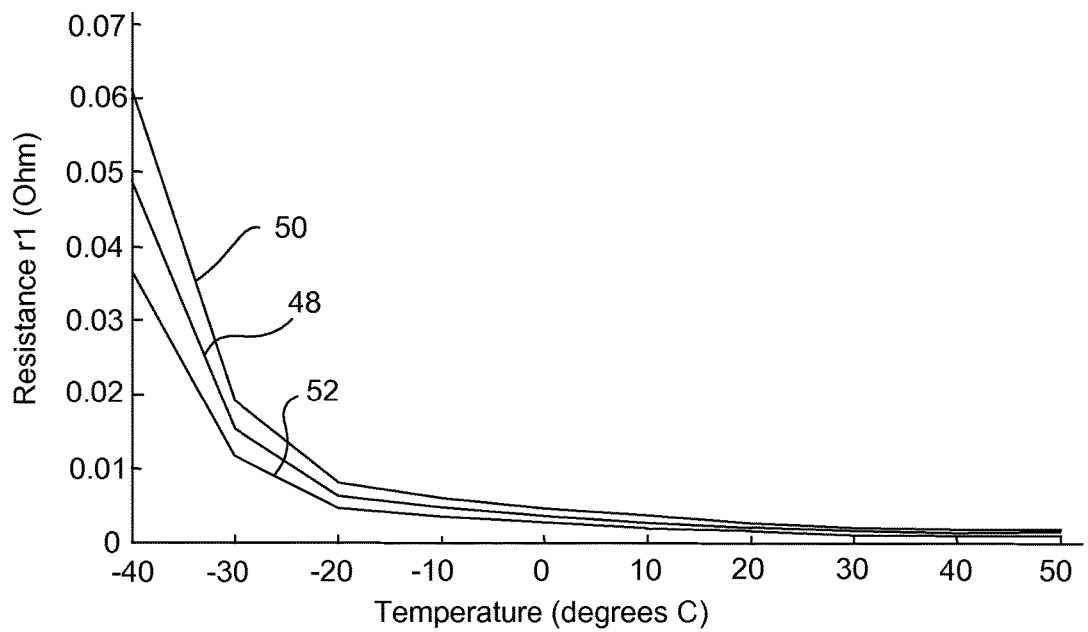
FIG. 4 is an exemplary graph illustrating life time change ranges of a first resistance parameter relative to temperature of the battery.

FIG. 4 is an exemplary graph illustrating life time change ranges of the first resistance r1 parameter relative to temperature, in degrees Celsius, of the battery. Line 48 in the graph illustrates an example of the first resistance r1 parameter relative to temperature (similar to FIG. 3). Line 50 in the graph illustrates an example of an upper limit $r1_{max}$ to the first resistance r1 parameter relative to temperature over the assumed lifetime of the battery. Line 52 in the graph illustrates an example of a lower limit $r1_{min}$ to the first resistance r1 parameter relative to temperature over the assumed lifetime of the battery. The assumed lifetime of the battery may be based on many factors but is basically an estimation as to how long, in general, a typical battery used in a particular system will be in service before being replaced or the particular system ceasing to be used.

This variation in the parameter for the first resistance r1 may also be charted relative to SOC. Thus, the upper and lower limits $r1_{max}$ and $r1_{min}$ may be a function of both battery temperature and SOC of the battery, if so desired. One skilled in the art may produce graphs for these parameters similar to the graph illustrated in FIG. 4 for the first resistance r1.

This variation in parameters (setting upper and lower bounds) over the assumed life time of the battery for the second resistance r2 and capacitance C is also true for battery temperature (and SOC of the battery, if so desired), thus upper and lower limits for the second resistance r2 and the capacitance C parameters may also be set for temperature (and SOC) over the assumed lifetime of the battery. The voltage V2 across the RC network may have limits set (in this example based on both temperature and SOC of the battery) based on the following equations.

If $i>0$, $V2_{min}=OCV-V-abs(i)*r1_{max}$(temperature, SOC) and $V2_{max}=OCV-V-abs(i)*r1_{min}$(temperature, SOC); and If $i<=i>0$, $V2_{min}=OCV-V+abs(i)*r1_{max}$(temperature, SOC) and $V2_{max}=OCV-V+abs(i)*r1_{max}$(temperature, SOC)

With OCV being the open circuit voltage, V being the battery terminal voltage, i being the current wherein i is a positive value if it flows out of the battery as indicated in FIG. 2, abs(i) being the absolute value of the current, $r1_{max}$(temperature, SOC) being the first resistance parameter upper limit based on the battery temperature and SOC, and r1min (temperature, SOC) being the first resistance parameter lower limit based on the battery temperature and SOC.

The graphs and values presented herein (in particular in FIGS. 3, 4 and 6) are exemplary and based on a particular battery and its use and thus the various measured values, estimated parameters and upper and lower limits for the parameters may of course vary based on the particular battery and use to which it is put. And, of course, the parameters for the particular battery and its use also may vary relative to the temperature, SOC and assumed lifetime of the battery. Thus, while graphs are presented for certain parameters herein, it is within the skill in the art to produce the graphs, and upper and lower limits, for the other parameters—for any particular battery and system within which the battery is used.

Once the upper and lower limits for the parameters of the battery equivalent circuit model are produced, either for a range of temperatures, a range of SOC, or for ranges of both temperature and SOC, then these upper and lower limits may be employed to model power capability estimation for the battery using the EKF.

Figure 5:
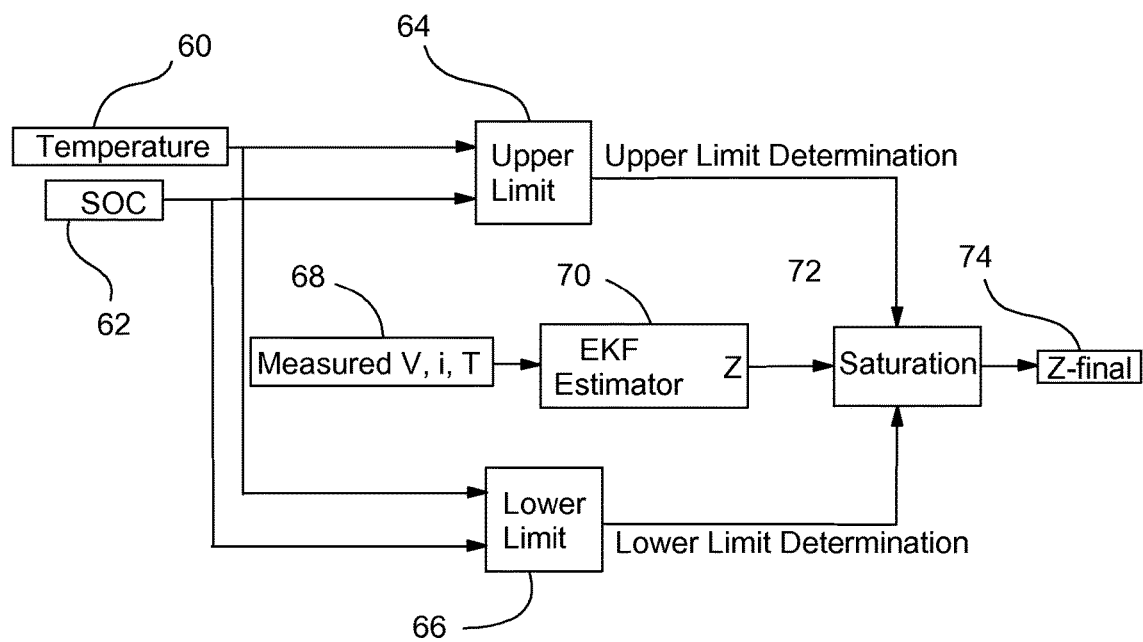
FIG. 5 is a schematic diagram for determining upper and lower parameter limits for the circuit model parameters.

FIG. 5 illustrates a schematic diagram for determining the circuit model parameters, while employing upper and lower limits for the parameters. In this figure, the variable Z is used to illustrate how the limiting is created for that particular parameter, with Z being the particular circuit model parameter being calculated at that time. For example, Z may be the first (series) resistance r1 parameter being calculated, in which case the particular operations occurring for that calculation of Z relate to the first resistance r1. Of course, the variable Z may represent one of the other parameters being calculated, which may use this process of FIG. 5 for each parameter being calculated.

The temperature, block 60, and/or SOC, block 62, are input to both an upper limit determiner, block 64, and a lower limit determiner, block 66. The battery temperature and SOC inputs may come from sensors, for example in a vehicle (such as in FIG. 1), and obtaining such values are known to those skilled in the art and so will not be discussed further herein. The upper and lower limit determiners 64, 66 may be look-up tables that are based on values for an upper limit and a lower limit of the particular parameter based on the input temperature, SOC or both (depending upon whether temperature, SOC or both are being employed for limiting the parameters). That is, the data of the graphs, examples of which are shown herein, can be stored in look-up tables for easy, quick access during calculations. If both temperature and SOC are employed, then the determiners may need two two-dimensional look-up tables where the data is stored. These upper limits and lower limits for the particular parameter being considered may also be adjusted in blocks 64, 66 based on the age of the battery (lifetime adjustments), if so desired. In such a case, the age of the battery (from beginning-of-life) is also employed to allow for adjustment of the particular parameter.

Also, the measured values for battery terminal voltage V, current i, and temperature T, block 68, are input into an EKF estimator, block 70 to initially estimate a value for the variable Z. The value Z is then adjusted to be at or between the upper and lower limits, block 72, before a final value for Z is output, block 74. For example, this may similarly be employed for estimating the voltage across the RC network V2 parameter.

Figure 6:
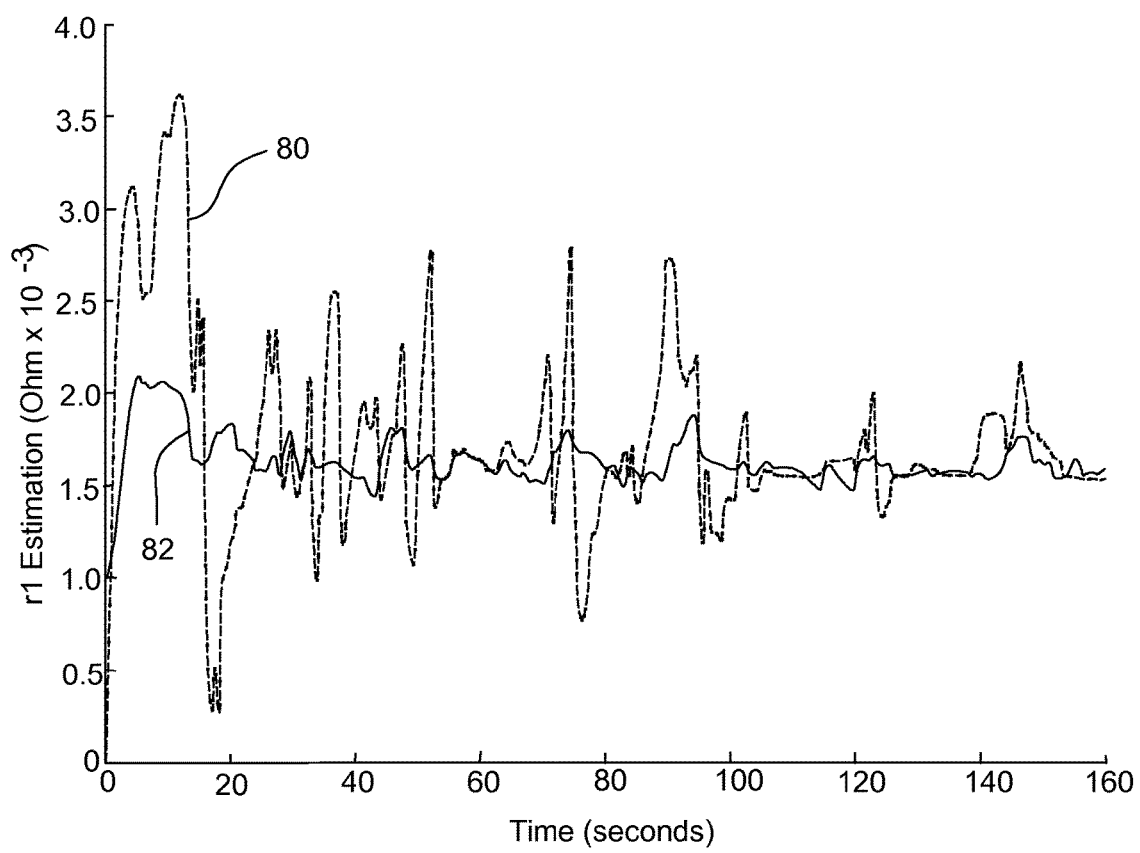
FIG. 6 is a graph illustrating an example of estimation of a first resistance parameter, with upper and lower limits set and without upper and lower limits set, over time, showing a comparison of the two estimations of the first resistance parameter.

FIG. 6 is a graph illustrating an example of estimation of the first resistance r1 parameter, with one calculation having upper and lower limits set and with another calculation without upper and lower limits set, over time, in order to show a comparison of the two estimations of the first resistance r1 parameter. In this particular example, the first resistance r1 parameter is being estimated, with the battery assumed to be warmed up (and thus the temperature relatively stable at about twenty six degrees C.) and with the SOC being relatively constant, so that one expects that the first resistance r1 should be relatively constant.

The dashed line 80 is the first resistance r1 estimation without any upper or lower limits set for the first resistance r1. This dashed line 80 employs EKF estimation without limits, which is not the method employed herein. This is for comparison to the estimation, discussed below, wherein upper and lower limits are set. One will note that the first resistance r1 estimation has very significant variations in the estimated value of the first resistance r1 over time, and does not converge very quickly. This also may allow for undesirable biased estimation of the particular parameters being estimated.

On the other hand, with the method of the present invention, one will note much improved estimation of the first resistance r1. The solid line 82 is the first resistance r1 estimation with upper and lower limits set for the first resistance r1, thus limiting the EKF estimation. In this example, the lower limit $r1_{min}$ is set at about 0.001 Ohm and the upper limit $r1_{max}$ is set at about 0.003 Ohm (which would come from lookup tables, such as those in blocks 64, 66 of FIG. 5) for the first resistance r1. One will note how much more quickly and accurately the first resistance r1 estimation converges.

While this example in FIG. 6 is for the first resistance r1, such improve convergence also occurs for the other parameter estimations employing EKF with upper and lower limits on the parameters based on temperature, SOC or both (depending upon whether one wishes to employ temperature, SOC or both in the estimation process).

Once the battery equivalent circuit model parameters are estimated, the battery equivalent circuit model may be employed to estimate battery power capability. The battery power capability may be, for example, displayed to a vehicle driver, may be used to adjust, control or regulate vehicle operations based on the estimated battery power capability, or both.

This battery power capability estimation may then be used when operating a system with a battery, such as the vehicle shown in FIG. 1, during the life of that particular vehicle and battery. The model parameters, such as those shown in FIGS. 3 and 4 may be obtained by pre-production battery testing that occurs before production of such vehicles, with the model parameters stored in look-up tables in the vehicle controller 27 (or any other type of suitable data storage medium, whether inside or separate from the controller). Any adjustments in parameters for the age of the battery may also be determined in pre-production battery testing and stored in the vehicle controller 27 (or other suitable data storage medium in the vehicle).

While certain embodiments of the present invention have been described in detail, those familiar with the art to which this invention relates will recognize various alternative designs and embodiments for practicing the invention as defined by the following claims.

What is claimed is:

1. A method comprising:
employing a battery circuit model, including a first resistance (r1) in series with a second resistance (r2) and a capacitance (C) in parallel to r2;
measuring a temperature of a battery;
setting upper and lower limits for r1, r2 and C based on the measured temperature;
determining a battery power capability by applying an Extended-Kalman-Filter to determine values for r1, r2 and C within the set limits;
controlling power sent from the battery to a motor providing motive power to vehicle wheels within limits that are based on the determined battery power capability.

2. The method of claim 1 wherein the upper and lower limits for r1, r2 and C are set also based on a state of charge (SOC) of the battery.

3. The method of claim 2 wherein the upper and lower limits for r1, r2 and C are adjusted based on an age of the battery.

4. The method of claim 2 wherein a measured current, and battery terminal voltage are input to the Extended-Kalman-Filter when determining the values for r1, r2 and C.

5. The method of claim 2 wherein the upper and lower limits for r1, r2 and C are set based on testing of the battery and are stored in lookup tables in a memory accessible by a controller.

6. The method of claim 1 wherein the upper and lower limits for r1, r2 and C are adjusted based on an age of the battery.

7. The method of claim 1 wherein a measured current, and battery terminal voltage are input to the Extended-Kalman-Filter when determining the values for r1, r2 and C.

8. The method of claim 1 wherein the upper and lower limits for r1, r2 and C are set based on testing of the battery and are stored in lookup tables in a memory accessible by a controller.

9. A method comprising:
employing a battery circuit model, including a first resistance (r1) in series with a second resistance (r2) and a capacitance (C) in parallel to r2;
measuring a state-of-charge of a battery;
setting upper and lower limits for r1, r2 and C based on the measured state-of-charge;
determining a battery power capability by applying an Extended-Kalman-Filter to determine values for r1, r2 and C within the set limits;
controlling power sent from the battery to a motor providing motive power to vehicle wheels within limits that are based on the battery power capability.

10. The method of claim 9 wherein the upper and lower limits for r1, r2 and C are set also based on a temperature of the battery.

11. The method of claim 10 wherein the upper and lower limits for r1, r2 and C are adjusted based on an age of the battery.

12. The method of claim 10 wherein a measured current, and battery terminal voltage are input to the Extended-Kalman-Filter when determining the values for r1, r2 and C.

13. The method of claim 10 wherein the upper and lower limits for r1, r2 and C are set based on testing of the battery and are stored in lookup tables in a memory accessible by a controller.

14. The method of claim 9 wherein the upper and lower limits for r1, r2 and C are adjusted based on an age of the battery.

15. The method of claim 9 wherein a measured current, and battery terminal voltage are input to the Extended-Kalman-Filter when determining the values for r1, r2 and C.

16. The method of claim 11 wherein a measured current, and battery terminal voltage are input to the Extended-Kalman-Filter when determining the values for r1, r2 and C.

17. The method of claim 9 wherein the upper and lower limits for r1, r2 and C are set based on testing of the battery and are stored in lookup tables in a memory accessible by a controller.

18. An electric vehicle comprising:
a motor configured to provide motive power to vehicle wheels;
a battery configured to provide power to the motor;
a controller configured to (a) estimate battery power capability by applying a battery circuit model, including a first resistance (r1) in series with a second resistance (r2) and a capacitance (C) in parallel to r2; setting upper and lower limits for r1, r2 and C based on a measured battery temperature; and applying an Extended-Kalman-Filter to determine values for r1, r2 and C within the set limits; and (b) control power sent from the battery to the motor within limits that are based on the determined values for r1, r2 and C.

19. The electric vehicle of claim 18 wherein setting the upper and lower limits for r1, r2 and C is also based on a state-of-charge of the battery.

20. The electric vehicle of claim 18 wherein estimating the battery power capability comprises adjusting the upper and lower limits for r1, r2 and C based on an age of the battery.

* * * * *